United States Patent
Tregilgas et al.

[11] Patent Number: 6,030,853
[45] Date of Patent: Feb. 29, 2000

[54] METHOD OF PRODUCING INTRINSIC P-TYPE HGCDTE USING CDTE CAPPING LAYER

[75] Inventors: John Harold Tregilgas, Richardson; Arthur Monroe Turner, Allen, both of Tex.

[73] Assignee: DRS FPA, L.P., Parsippany, N.J.

[21] Appl. No.: 08/106,252

[22] Filed: Aug. 13, 1993

[51] Int. Cl.[7] .................................................. H01L 21/00
[52] U.S. Cl. ........................................... 438/95; 438/102
[58] Field of Search .................................. 437/5, 160, 64, 437/987, 247, 248; 438/95, 102

[56] References Cited

U.S. PATENT DOCUMENTS 4,927,773   5/1990   Jack et al. ................................. 437/987
4,950,615   8/1990   Basol et al. ............................... 437/247

*Primary Examiner*—John F. Niebling
*Assistant Examiner*—Lynne A. Gurley
*Attorney, Agent, or Firm*—Thelen Reid & Priest LLP

[57] ABSTRACT

A hybrid focal plane array has $Hg_{1-x}Cd_xTe$ junction photodiodes formed in a substrate of HgCdTe which is capped by a layer of Te-rich CdTe. Type conversion of a low metal vacancy HgCdTe substrate to p-type is performed by annealing the capped substrate at a temperature sufficient to support interdiffusion between the Te-rich CdTe capping layer and the HgCdTe substrate. Use of the CdTe capping layer with a slight excess Te maintains the surface of the HgCdTe substrate in a Te-rich phase condition.

12 Claims, 3 Drawing Sheets

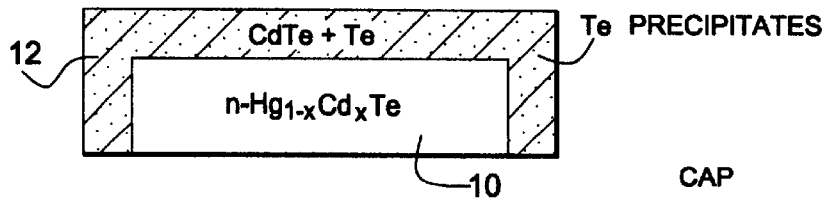
FIG. 1    CAP
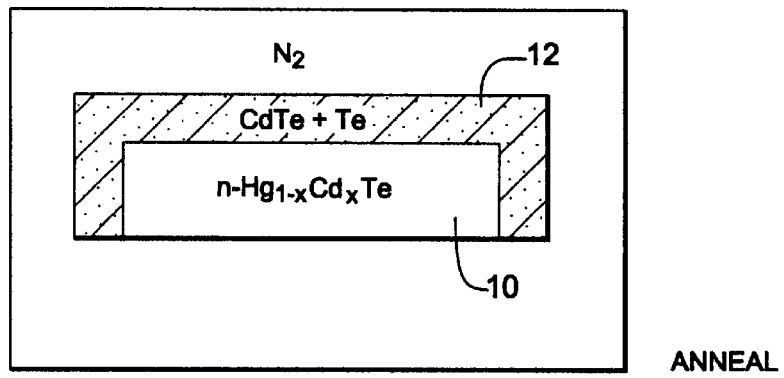
FIG. 2    ANNEAL
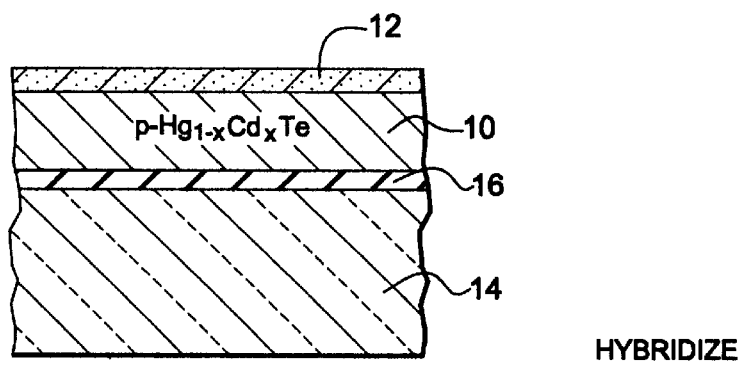
FIG. 3    HYBRIDIZE
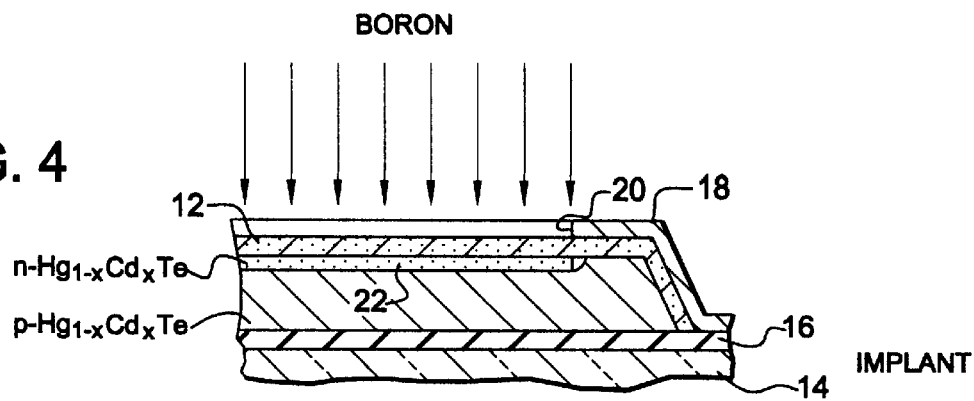
FIG. 4    IMPLANT

METHOD OF PRODUCING INTRINSIC P-TYPE HGCDTE USING CDTE CAPPING LAYER

TECHNICAL FIELD OF THE INVENTION

This invention relates generally to the formation of p-type semiconductor materials, and in particular to a method for forming an intrinsically doped p-type substrate of mercury cadmium telluride (p-HgCdTe), whereby the metal vacancy acceptor concentration is established during interdiffusion annealing with a capping layer.

BACKGROUND OF THE INVENTION

Semiconductors having elements from Group II and Group VI of the periodic table, such as mercury cadmium telluride, have been used to good advantage in the fabrication of infrared radiation detectors and imagers which operate in the lower infrared frequency band down to the limits of the available long wave length atmospheric window, i.e., at wavelengths of 8–12 microns. The detection of such long wavelength radiation, if it is to be done using a detector at only moderate cryogenic temperatures, e.g. at liquid nitrogen rather than liquid helium temperatures, is preferably done using a very narrow bandgap semiconductor, such as $Hg_{1-x}Cd_xTe$.

Since HgTe is a semimetal (having a very small negative bandgap), and CdTe has a bandgap of about 1.56 eV, compositions having a small and arbitrarily selectable bandgap may be specified simply by varying the proportions of an alloy having the composition $Hg_{1-x}Cd_xTe$. Such alloys are here referred to generically as "HgCdTe". For example, for x=0.2 the composition $Hg_{0.8}Cd_{0.2}Te$ is a 10 micron material, that is, a composition having a bandgap approximately equal to the photon energy of infrared light having a wavelength of 10 microns. By reducing the percentage of cadmium, compositions having a smaller bandgap, and therefore a longer operating wavelength, may be produced.

DESCRIPTION OF THE PRIOR ART

In conventional methods for forming optical detector arrays, p-n junction photodiodes have been used as optical detectors and have been interconnected with various forms of image processing circuitry. In the formation of such arrays, large numbers of p-n junctions are produced by forming n-type regions on the surface of a p-type HgCdTe substrate. The diodes, each formed at a junction of n-type and p-type semiconductor material, form individual photodetectors, and each photodetector defines a pixel within the photodetector array.

In the formation of such detectors, it is important that the n-type regions are precisely formed so that the resulting photodetectors have low leakage currents, high dynamic resistance and low crosstalk and can therefore be closely spaced to enhance the resolution of the resulting photodetector array. Such photodetector structures may be formed of bodies or wafers including compounds of the Group II and Group VI elemental groups of the periodic table, such as HgCdTe, and may include a protective layer such as cadmium telluride (CdTe) deposited on the HgCdTe wafer to act as a passivation layer, antireflective coating and an insulator for interconnect metals. A photoresist pattern is typically formed above the passivation/insulation layer, the photoresist pattern having multiple diffusion window openings mutually spaced in accordance with the desired photodetector array pattern, and in accordance with the resolution desired.

Photodiode junctions photodiodes have been formed in vacancy doped p-HgCdTe by implantation damage through photographically defined windows into the p-type HgCdTe material, or by converting a thin layer of the p-type HgCdTe material into n-type by appropriate annealing in a saturated Hg atmosphere. At the appropriate annealing temperature, Hg will diffuse through the windows into the substrate and thereby reduce the concentration of metal vacancy acceptor sites in the substrate beneath the windows. Consequently, a surface region of the HgCdTe substrate will convert from p-type to n-type during mercury indiffusion if the impurity donor concentration exceeds the impurity acceptor concentration of the substrate and if the indiffusion temperature and anneal time are chosen to reduce the metal vacancy acceptor concentration below the critical level, fewer than $10^{15}$ carriers/cm$^3$ and preferably approaching $10^{14}$ carriers/cm$^3$.

Previously, intrinsically doped p-type HgCdTe liquid phase epitaxy (LPE) samples were annealed after growth to remove excess Te and set the vacancy concentration by annealing in saturated Hg vapor at temperatures between about 200–450° C. Cooling from the anneal temperature would allow the vacancy concentration to relax if cooling was too slow, or more likely, the near surface concentration of vacancies would be reduced by in-diffusing Hg. Quenching ampoules with both HgCdTe slices and free Hg can lead to condensation of the Hg at the quartz ampoule wall while the slice is still hot, thereby allowing more Hg to outdiffuse from the HgCdTe and resulting in higher intrinsic acceptor densities near the surface.

Alternatively, p-type HgCdTe material may be annealed on the Te-rich side of the phase diagram to reduce the anneal temperature necessary to get a particular vacancy concentration, but vacuum, inert gas or Te-rich annealing of uncapped HgCdTe surfaces can lead to surface decomposition and vapor transport growth of HgTe surface crystals. Capping HgCdTe surfaces with ZnS prior to vacuum annealing has been used during vacuum annealing to prevent surface degradation, but ZnS is considered to be a diffusion barrier for Hg and can retard vacancy formation.

SUMMARY OF THE INVENTION

According to the present invention, there is provided a method for establishing a metal vacancy concentration in a substrate of HgCdTe which includes the step of capping the substrate with a layer of Te-rich CdTe and thereafter annealing the capped substrate at a temperature which is sufficient to support interdiffusion between the Te-rich CdTe layer and the HgCdTe substrate. Further, according to the present invention, there is a provided a method for forming an intrinsically doped p-type substrate of HgCdTe in which a low metal vacancy substrate, either as-grown n-type HgCdTe or lightly doped p-type HgCdTe, is capped with a layer of Te-rich CdTe, and the metal vacancy concentration is increased by annealing the capped substrate at a temperature sufficient to support interdiffusion between the Te-rich CdTe layer and the HgCdTe substrate. The Te-rich CdTe cap layer inhibits indiffusion of Hg except for areas where the CdTe layer has been removed. This allows patterned diode junction formation, but prevents vacancy concentration surface anomalies and surface damage which may occur if the substrate is contacted by an Hg ambient during post-anneal cooling or quenching.

To circumvent the problems associated with producing intrinsically p-type material during quenching from Hg saturated ambients, surface degradation during vacuum annealing, and post-anneal relaxation in carrier concentration, low metal vacancy-HgCdTe slices are capped with Te-rich CdTe prior to annealing in a vacuum or inert gas ambient to set the metal vacancy concentration. Use of single or polycrystalline CdTe capping layers with a slight excess Te pins the surface of the HgCdTe on the Te-rich side of the phase diagram and allows reduced annealing temperatures compared to Hg saturated annealing.

The bandgap of the HgCdTe material is determined in part by controlling the exact composition of the alloy used, including the metal vacancy concentration. Since the bandgap varies with the composition, it is necessary for many applications that the composition of the alloy be uniform, and the metal vacancy concentration be maintained at a predetermined value. A uniform mixture of mercury, cadmium and tellurium is usually achieved by preparing them as a homogenous liquid mixture. Due to the very high vapor pressure of mercury at all temperatures of interest, it is difficult to prevent mercury from escaping from the solid-liquid mixture into any adjacent vacant space, including voids which may be created during the freezing of the mixture. The Te-rich CdTe capping layer protects the surface and inhibits both Hg losses and indiffusion during cooling since Hg diffuses much more slowly in the Te-rich CdTe capping layer than in HgCdTe.

TECHNICAL ADVANTAGES

The present invention provides several technical advantages over prior techniques for forming photodiodes. One significant advantage is that any low metal vacancy HgCdTe, for example lightly doped p-type or n-type HgCdTe may be used as the stock substrate material.

Another important technical advantage over prior techniques is that the vacancy concentration level in the HgCdTe substrate may be set to a predetermined value which is compatible with a particular junction formation process, such as ion implantation, high energy proton bombardment, indiffusion of Hg, and ion milling.

A related technical advantage provided by the invention is that the Te-rich CdTe cap provides passivation protection while maintaining a desired vacancy concentration in the HgCdTe substrate.

A further technical advantage provided by the method of the present invention is that the Te-rich CdTe cap serves as a barrier which prevents changing the vacancy concentration in the HgCdTe substrate as it is cooled. By providing a Te-rich CdTe cap layer, surface transport is inhibited and vacancy concentrations may be established and maintained which are outside of the normal range of possibility.

Another technical advantage in using the Te-saturated CdTe cap layer for setting the metal vacancy acceptor concentration is that it provides repeatability and controllability needed for high yield, high throughput processing.

BRIEF DESCRIPTION OF THE DRAWINGS

For a more complete understanding of the present invention, and the advantages thereof, reference is now made to the following specification and accompanying drawings, in which:

FIG. 1 is a simplified diagram which shows an n-type HgCdTe slice encapsulated within a Te-rich CdTe cap;

FIG. 2 is a simplified schematic diagram which illustrates an annealing step;

FIG. 3 is a magnified cross-sectional view of the capped slice which has been annealed and epoxy hybridized to a read out integrated circuit chip;

FIG. 4 is a view similar to FIG. 3 which illustrates the implantation of Boron ions into a surface region of the p-type substrate;

DETAILED DESCRIPTION OF THE INVENTION

Figure 5:
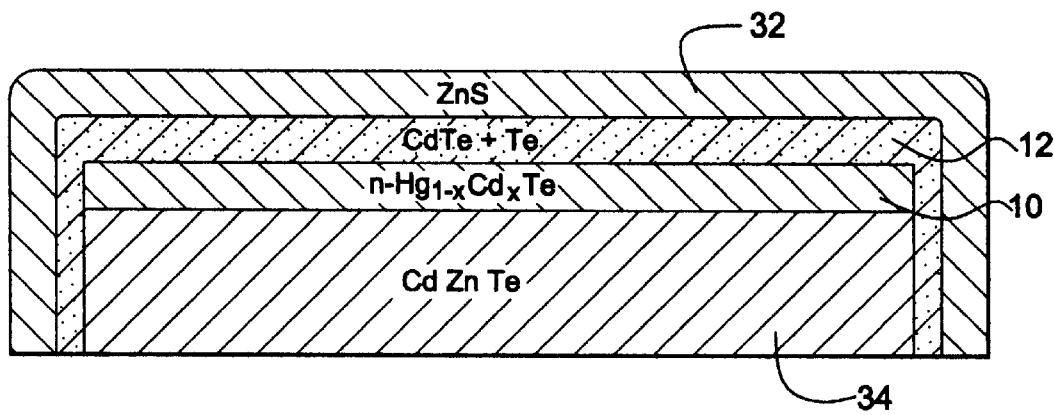
FIG. 5 is a view similar to FIG. 1 which illustrates an alternative substrate arrangement in which the n-type HgCdTe is grown by liquid phase epitaxy (LPE) on a CdZnTe substrate, and capped by Te-rich CdTe and ZnS.

The present invention permits reliable formation of p-type $Hg_{1-x}Cd_xTe$ from low metal vacancy HgCdTe, with the vacancy carrier concentration level in the substrate being fixed at a repeatable value which is dependent on the anneal temperature and the anneal time duration.

As used herein, "Te-rich" and "excess Te" mean the presence of tellurium in a mole fraction which exceeds the amount of tellurium found in the stoichiometric solid phase of $Cd_xTe_{1-x}$, where $x<0.5$. That is, Te precipitates are present in the solid phase of Te-rich $Cd_xTe_{1-x}$.

As used herein, "low metal vacancy" material refers to either n-type material or lightly doped p-type material, where $p<5\times10^{15}$ metal vacancies.

Referring initially to FIG. 1, a substrate 10 of n-type $Hg_{1-x}Cd_xTe$ is loaded within a reactor chamber (not shown) for receiving a cap 12 of Te-rich cadmium telluride. Preferably, the cap 12 is deposited by evaporation of CdTe to yield CdTe plus Te, with the excess Te being present as a precipitate in an amount of from about one percent to about twenty percent. Other methods for depositing the cap 12 may be utilized such as by sputtering CdTe to yield CdTe plus excess Te, by hot-wall epitaxy (HWE), molecular beam epitaxy (MBE) and MOCVD. Preferably, the HgCdTe substate 10 is an n-type HgCdTe substrate having a donor concentration in the range of from $1\times10^{13}-1\times10^{15}/cc$. Alternatively, the substrate 10 may be p-type HgCdTe having a relatively low p-type concentration, less than $1\times10^{16}/cc$.

In the embodiment of the method illustrated in FIGS. 1–4, a vertically integrated photodiode is formed which, in association with several other similar photodiodes (not shown), which are mutually and laterally spaced on either side of the illustrated portion of the diode structure (see FIG. 6), each photodiode corresponds to a single pixel of the photodiode array.

Referring again to FIG. 1, the substrate 10 is a planar slice of vacancy doped n-type semiconductor material having elements from the low metal vacancy Group II—Group VI elemental groups of the periodic table. The semiconductor material consists substantially of a II–VI or a II–IV–VI compound semiconductor selected from the group consisting of mercury cadmium telluride (HgCdTe), mercury manganese telluride (HgMnTe), or mercury zinc telluride (HgZnTe). The cap 12 of tellurium rich CdTe is deposited on the upper and side surfaces of the substrate 10. After the low metal vacancy substrate 10 has been capped, it is placed in an annealing oven to effect type conversion of the substrate to p-type HgCdTe, and also to set the metal vacancy acceptor concentration within the p-type HgCdTe slice.

Various annealing temperatures and annealing times may be used. For example, at 250° C., the annealing time is one hour to more than one day, and for an annealing temperature of 440° C., the annealing time is one-half hour or more. The anneal is performed preferably in an $N_2$ atmosphere, or in the presence of some other inert gas, or in a vacuum.

Prior to applying the tellurium rich CdTe cap layer, the mercury cadmium telluride surface is polished. Thereafter, the tellurium rich CdTe material is deposited in a layer about 2000 Å thick. The annealing may be performed in a non-oxidizing atmosphere, for example vacuum, inert, Te-saturated, Hg-deficient or Hg-saturated.

Figure 6:
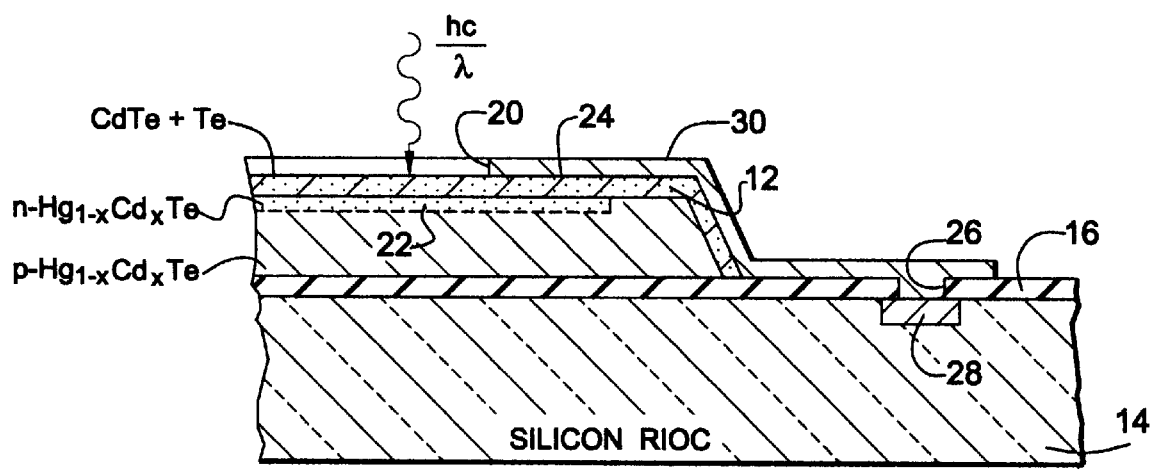
FIG. 6 is a magnified cross-sectional view of a hybrid focal plane array in which the $Hg_{1-x}Cd_xTe$ junction photodiodes of FIG. 4 are mounted on the input stage of a silicon read out integrated circuit.

Referring now to FIG. 3, the substrate 10 and transition cap 12 are epoxy hybridized to a read out IC, thinned to reduce the overall thickness of the HgCdTe and CdTe passivation layer from 40–60 microns to about 10 microns or less. The exposed face of the HgCdTe body is inverted and mounted on a semiconductor circuit chip 14 by a layer 16 of an epoxy adhesive, as shown in FIG. 3 and FIG. 6.

Referring again to FIG. 4, a mask 18 of photoresistant material is applied over the cap 12 and includes at least one window opening 20 to allow ion implantation into the HgCdTe. When utilized in the formation of multiple diodes, for example of a photodetector array having multiple photodetectors, the mask 18 includes multiple window openings 20 which are appropriately patterned and mutually spaced according to the desired number of photodetector diodes of the infrared photodetector array to be fabricated.

After annealing, the subatrate 10 has p-type conductivity and an acceptor concentration of at least $10^{15}/cm^3$ and a mobility of about $5 \times 10^2$ $cm^2v^{-1}sec^{-1}$$^1$. In its broader scope, the Group II–Group VI of the substrate 10 may include compounds of the Group II and Group VI elemental groups other than mercury, cadmium and tellurium, as well as additional elements.

Referring now to FIG. 4, an n-type region is formed on the surface of the p-type HgCdTe by exposing the surface to an ion implant beam. Implanted ions travel through the cap 12 and type convert the underlying HgCdTe crystal by releasing interstitial mercury, thereby defining an n-type region 22. The n-type region 22 forms a n-on-p junction directly beneath the cap 12 which is coincident with each mask window opening 20.

To complete the formation and electrical interconnection of the photodiode device, the mask 18 is removed and vias 24, 26 are formed through the cap 12 and the epoxy layer 16, respectively, for the purpose of exposing the underlying n-type region 22 and a conductive contact pad 28 embedded in the silicon read out IC chip 14. An electrically conductive layer 30 is then formed over the cap 12, and also within each via 24, 26, respectively. Preferably, the conductive layer 30 is a layer of indium metal applied by evaporation. The resulting structure provides an n/p diode which is sensitive to infrared radiation, and which is in electrical contact with the integrated circuit 14. Output signals produced by the photodiodes upon illumination by infrared radiation are thus conducted through the conductive layer 30 to the circuit device 14, which in one application processes the inputs received from each of the photodetectors in the photodetector array to form electrical signals corresponding to the image pattern sensed by the array.

Annealing of the substrate 10 capped by the Te-rich CdTe cap 12 in a vacuum or an inert gas ambient for 15 minutes or longer (depending on temperature, typically 200–450° C.) will preset the HgCdTe surface to the Te saturated side of the phase diagram (FIG. 8) without surface degradation occurring. Moreover, the samples may be annealed in an ampoule and quenched by removing them from the ampoule and exposing them to a flowing gas to expedite cooling from the 400–450° C. range, thereby quenching in much higher vacancy concentrations (e.g., p=about $2 \times 10^{18}/cc$), which cannot be obtained without Te-rich CdTe capping.

A ZnS layer may also be used, as shown in FIG. 5, if desired by depositing it on top of the Te-rich CdTe layer 12, but is not necessary if the Te-rich CdTe is sufficiently thick (i.e., 1000–5000 angstroms or more). In this embodiment, the low metal vacancy HgCdTe substrate 10 is grown by liquid phase epitaxy (LPE) on a substrate 34 of CdZnTe.

Figure 7:
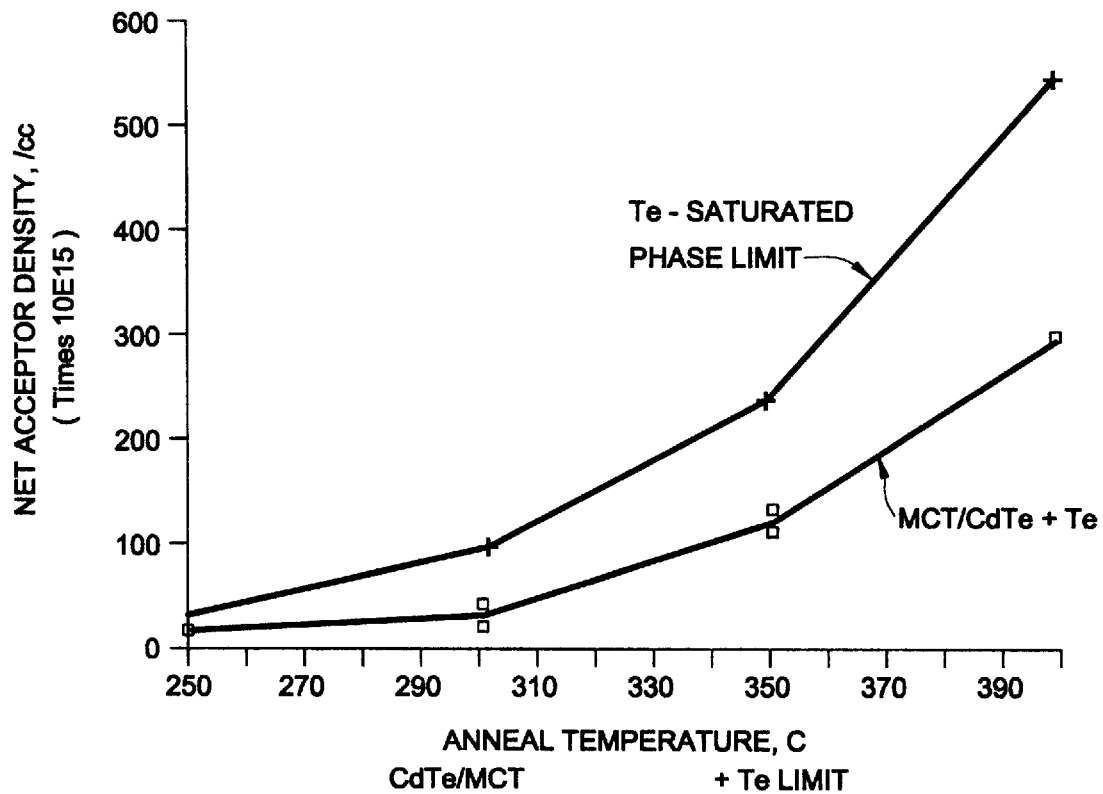
FIG. 7 illustrates the net acceptor density in the p-type HgCdTe substrate of FIG. 3 for four different anneal temperatures; and, FIG. 8 is a schematic phase diagram for a mole fraction Te as a function of temperature for $Hg_{1-x}Cd_xTe$.

Te-rich CdTe is deposited in a layer 12 by evaporation or sputtering on low metal vacancy HgCdTe substrate 10 to set the vacancy concentration to a predetermined level. HgCdTe LPE substrate 10 are capped with about 2000 angstroms thick cap 12 of Te-rich CdTe prior to annealing in inert gas at temperatures between about 180° C. and 440° C. Optionally, thin capping layers (less than 1000 angstroms) are topped with 3000–4000 angstroms of ZnS prior to annealing, as shown in FIG. 5. Vacancy carrier concentrations within the p-type HgCdTe substrate 10 are controlled by the final annealing temperature and duration. The net acceptor densities in the p-type HgCdTe substrate 10 for four different anneal temperatures are illustrated in FIG. 7. Cooling of the resealable quartz ampoule is used for samples at about 400° C. or below. Above 400° C. samples are removed from the ampoule and quenched by flowing gas across the capped slice.

Conventional techniques for preparation of high purity HgCdTe consistently yield low metal vacancy $Cd_xHg_{1-x}Te$ of the composition x=0.20 with carrier concentrations in the $10^{14}$–$10^{15}$ range, either n-type or lightly doped p-type. However, for practical as well as theoretical reasons, p-type $Hg_{1-x}Cd_xTe$ has been the dominant substrate for forming n+-on-p or n-on-p diode junctions. Implanting to form n-type layers in p-type HgCdTe is more convenient than implanting to form p-type layers in an n-type substrate because activation and damage reduction anneals are not required.

Consequently, according to prior practice it has been necessary to convert low metal vacancy HgCdTe, either the as-grown low metal vacancy HgCdTe or lightly doped p-type HgCdTe substrate to more highly doped p-type material. This conversion from low metal vacancy HgCdTe to highly doped p-type occurs simultaneously with the carrier concentration setting step of the present invention, so that a separate type conversion step is not required.

Junction formation by ion implantation into the p-type HgCdTe material is a function of several variables, including implant energy, implant dose, and vacancy concentration in the HgCdTe substrate. P-type vacancy concentration within the p-type HgCdTe substrate 10 in the range of from about $1 \times 10^{15}/cm^3$ to about $2 \times 10^{18}/cm^3$ is desirable for establishing the n-type regions 22 in p-type $Hg_{1-x}Cd_xTe$ by ion implantation.

Figure 8:
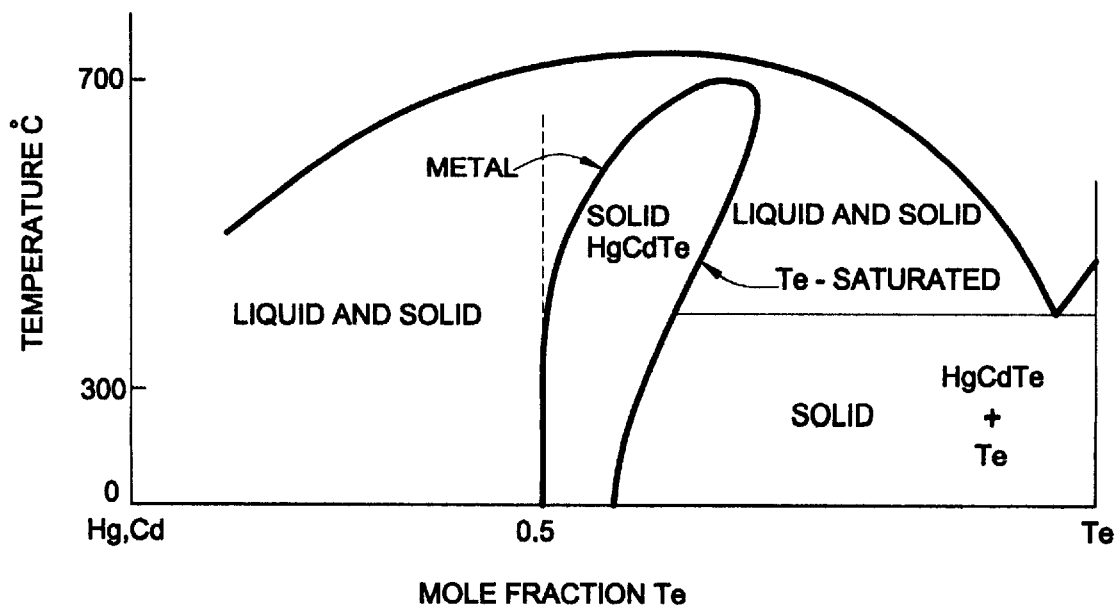

For example, the Te-rich CdTe capped substrate 10 that is being annealed under a nitrogen ambient at 440° C. near the tellurium melting point may be taken out of the nitrogen ambient and force cooled with flowing nitrogen or air to provide a very rapid quench while maintaining a vacancy concentration in the $10^{18}$ range, which is difficult to achieve in substrate materials that are being slowly cooled. The Te-rich CdTe cap 12 keeps the substrate material 10 pinned on the tellurium saturated side of the phase diagram, as shown in FIG. 8, so that the Hg cannot diffuse and alter the vacancy concentration.

Although the present invention and its advantages have been described in detail, it should be understood that various changes, substitutions and alterations can be made herein without departing from the spirit and scope of the invention as defined by the appended claims.

What is claimed is:

1. A method for establishing a metal vacancy concentration in a substrate of mercury cadmium telluride comprising the steps:

capping the substrate with a layer of tellurium rich cadmium telluride;

annealing the capped substrate at a temperature sufficient to support interdiffusion between the telluride rich cadmium telluride layer and the mercury cadmium telluride substrate; and quenching the annealed substrate by exposing it to a flowing gas.

2. A method for establishing a metal vacancy concentration as defined in claim 1, wherein the tellurium rich cadmium telluride is characterized by the presence of excess tellurium in the range of from about 0.001 to about 20 percent.

3. A method for establishing a metal vacancy concentration as defined in claim 1, wherein the mercury cadmium telluride substrate is made of an alloy having the formula $Hg_{1-x}Cd_xTe$, where x is a positive number less than one.

4. A method for establishing a metal vacancy concentration as defined in claim 1, wherein said substrate has a metal vacancy concentration less than $1 \times 10^{16}$ cm$^{-3}$ prior to annealing.

5. A method for establishing a metal vacancy concentration as defined in claim 4, wherein the substrate comprises n-type HgCdTe material.

6. A method for establishing a metal vacancy concentration as defined in claim 1, wherein the substrate comprises P-type HgCdTe material.

7. A method for establishing a metal vacancy concentration as defined in claim 1, wherein the annealing step is performed at a temperature in the range of from about 180° C. to about 450° C.

8. A method for forming an intrinsically doped p-type substrate of mercury cadmium telluride comprising the steps:

providing a substrate of mercury cadmium telluride;

capping the substrate with a layer of telluride rich cadmium telluride;

annealing the capped substrate at a temperature sufficient to support interdiffusion between the telluride rich cadmium telluride layer and the mercury cadmium telluride substrate; and quenching the capped substrate by exposing it to a flowing gas.

9. A method as defined in claim 8, wherein the tellurium rich cadmium telluride is characterized by the presence of excess tellurium in the range of from about 0.001 to about 20 percent.

10. A method as defined in claim 8, wherein the mercury cadmium telluride substrate is made of an alloy having the formula $Hg_{1-x}Cd_xTe$, where x is a positive number less than one.

11. A method as defined in claim 8, wherein the annealing step is performed at a temperature in the range of from about 180° C. to about 450° C.

12. A method as defined in claim 8, wherein the annealing step is performed from about 30 minutes to about 10 days.

* * * * *